(12) United States Patent
Nakano et al.

(10) Patent No.: US 8,097,386 B2
(45) Date of Patent: Jan. 17, 2012

(54) POSITIVE-TYPE PHOTOSENSITIVE RESIN COMPOSITION, METHOD FOR PRODUCING PATTERNS, AND ELECTRONIC PARTS

(75) Inventors: Hajime Nakano, Ibaraki (JP); Noriyuki Yamazaki, Ibaraki (JP); Yoshiko Futagawa, Tokyo (JP); Yoshika Satou, Ibaraki (JP); Dai Kawasaki, Ibaraki (JP); Takumi Ueno, Ibaraki (JP)

(73) Assignee: Hitachi Chemical DuPont Microsystems, Ltd., Tokyo (JP)

( * ) Notice: Subject to any disclaimer, the term of this patent is extended or adjusted under 35 U.S.C. 154(b) by 533 days.

(21) Appl. No.: 12/377,419

(22) PCT Filed: Aug. 14, 2006

(86) PCT No.: PCT/JP2006/316018
§ 371 (c)(1),
(2), (4) Date: Feb. 13, 2009

(87) PCT Pub. No.: WO2008/020469
PCT Pub. Date: Feb. 21, 2008

(65) Prior Publication Data
US 2010/0227126 A1 Sep. 9, 2010

(51) Int. Cl.
G03F 7/023 (2006.01)
G03F 7/30 (2006.01)
G03F 7/40 (2006.01)

(52) U.S. Cl. .......... 430/18; 430/191; 430/192; 430/326; 430/330

(58) Field of Classification Search .......... 430/18, 430/191, 192, 193, 326, 330
See application file for complete search history.

(56) References Cited

U.S. PATENT DOCUMENTS

| | | | |
|---|---|---|---|
| 6,001,517 A * | 12/1999 | Kawamonzen ........... | 430/18 |
| 6,310,135 B1 | 10/2001 | Tanaka et al. | |
| 6,613,699 B2 * | 9/2003 | Banba et al. ........... | 438/780 |
| 6,960,420 B2 | 11/2005 | Komatsu | |
| 2002/0032273 A1 | 3/2002 | Tanaka et al. | |
| 2002/0035196 A1 | 3/2002 | Tanaka et al. | |
| 2004/0142275 A1 | 7/2004 | Komatsu | |
| 2005/0244739 A1 * | 11/2005 | Kanatani et al. ........ | 430/270.1 |

FOREIGN PATENT DOCUMENTS

| | | |
|---|---|---|
| JP | 54-109828 | 8/1979 |
| JP | 64-046862 | 2/1989 |
| JP | 04-204945 | 7/1992 |
| JP | 08-286374 | 11/1996 |
| JP | 10-228107 | 8/1998 |
| JP | 11-279404 | 10/1999 |
| JP | 2000-284471 | 10/2000 |
| JP | 2000-310853 | 11/2000 |
| JP | 2001-329061 | 11/2001 |
| JP | 2002-258485 | 9/2002 |
| JP | 2002-278051 | 9/2002 |
| JP | 2003-330167 | 11/2003 |
| JP | 2004-170611 | 6/2004 |
| JP | 2004-206032 | 7/2004 |
| JP | 2004-306018 | 11/2004 |
| JP | 2005-500561 | 1/2005 |
| JP | 2005-099661 | 4/2005 |
| JP | 2006-184660 | 7/2006 |
| JP | 2007-017959 | 1/2007 |
| JP | 2008-046258 | 2/2008 |
| KR | 1999-007871 | 1/1999 |
| KR | 10-2004-0040349 | 5/2004 |
| WO | WO 03/001293 | 1/2003 |

OTHER PUBLICATIONS

Japanese Official Action mailed May 11, 2010, for Application No. 2005-042326.
Korean Official Action dated Nov. 17, 2010, for KR Application No. 10-2009-7002368.
Office Action dated Nov. 1, 2011, for Patent Application No. 2008-529792; 2 pages; Japanese Patent Office, Japan.

* cited by examiner

*Primary Examiner* — John Chu
(74) *Attorney, Agent, or Firm* — Antonelli, Terry, Stout & Kraus, LLP.

(57) ABSTRACT

A positive-type photosensitive resin composition for electronic materials having good film adhesiveness and sensitivity without causing a corrosion reaction to copper and copper alloys in metal wirings, a method for producing patterns and electronic parts are provided. The positive-type photosensitive resin composition includes (A) a polybenzoxazole precursor having a structure represented by the following general formula (I):

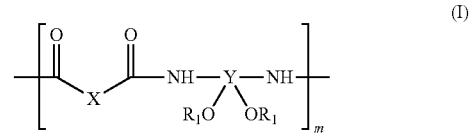

wherein X represents a bivalent organic group, Y represents a tetravalent organic group, $R_1$ represents a hydrogen atom or a monovalent organic group, and m represents an integer of 2 to 500 which represents a repeating unit number of the polymer, (B) a solvent, (C) a tetrazole derivative and (D) a compound which generates an acid by light.

6 Claims, 2 Drawing Sheets

FIG.5

POSITIVE-TYPE PHOTOSENSITIVE RESIN COMPOSITION, METHOD FOR PRODUCING PATTERNS, AND ELECTRONIC PARTS

TECHNICAL FIELD

The present invention relates to a positive-type photosensitive resin composition having a heat resistance and a method for producing a relief pattern by the use thereof. The present invention also relates to electronic parts such as semiconductor devices having a surface protective film and an interlayer insulation film formed using the positive-type photosensitive resin.

BACKGROUND ART

Since polyimide resins are excellent in heat resistance, they are widely used for fields of semiconductor elements. In particular, the polyimide resins are used as interlayer insulation films, and surface protective films (buffer coatings) provided between a sealant and a semiconductor chip.

Here, the surface protective film (buffer coating) is a film which plays a role to prevent that an aluminium thin film circuit or an oxidized film formed in a preceding step is damaged while at work of a post-step and cracks occur due to a difference of thermal expansion coefficients of the sealant and silicon after mounting the semiconductor chip. The surface protective film composed of the polyimide resin has been noticed because of having not only ability to protect the chip from external damage as described above but also ability to protect from radiation damage due to having a high α-ray blocking ability. Furthermore, the polyimide resin has been also noticed as a tool to perform a patterning process simply and certainly.

Recently, photosensitive polyimide where a photosensitivity is imparted to the polyimide resin by adding or mixing a compound having a photosensitive group to an acid functional group of a polyimide precursor so that the relief pattern can be formed easily by application, exposure and development has been becoming a mainstream in order to shorten a process for producing the semiconductor (e.g., see Patent Documents 1 and 2).

Also recently, the development by an alkaline aqueous solution is increasingly required in the light of material cost and environmental conservation. Thus currently, a photosensitive resin using a polybenzoxazole precursor having the acid functional group as a base resin or the like have been proposed as the interlayer insulation film and the surface protective film (buffer coating) (e.g., see Patent Document 3).

However, conventional polyimide-based resin has had a problem that it has a corrosive nature to metals such as copper and copper alloys commonly used as semiconductor materials. This is because a carboxyl group which is the acid functional group contained in a structure of polyamic acid in the polyimide precursor reacts with the metal such as copper and copper alloys.

That is, for example, when an interlayer insulation film for a multilayer wiring plate is formed by applying a polyimide precursor varnish on a substrate where a metal wiring or a metal layer composed of the copper or copper alloy has been formed, the carboxyl group contained in the structure in polyamic acid contained in this polyimide precursor varnish causes a corrosive action upon the copper or copper alloy and further generates copper ion. As a result, various problems such as poor insulation, breaking of wire, short circuit, rust in metal portions, reduction of film adhesiveness and deterioration of film physical properties are caused.

Also, when a resist film is formed using a photosensitive polyimide precursor on the substrate where the metal wiring or the metal layer composed of the copper or copper alloy has been formed, the carboxyl group in the photosensitive polyimide precursor chemically reacts with the copper or copper alloy, thereby incompletely removing a polyimide film in an unexposed portion to leave a residual film upon development. In order to solve this problem, it has been proposed to contain 1H-tetrazole or a derivative thereof in the polyimide-based resin (see patent Document 4). However, the adhesiveness, particularly the adhesiveness under a strict condition such as heating and applying pressure is not ameliorated sufficiently even in this method.

The aforementioned polybenzoxazole precursor also causes the corrosive action upon the copper or copper alloy similarly to the polyimide precursor because it also has a phenolic hydroxyl group as the acidic functional group. As a result, various problems, e.g., the poor insulation, the breaking of wire, the short circuit, the rust in metal portions, the reduction of film adhesiveness and the deterioration of film physical properties have been caused.

Patent Document 1: Japanese Patent Application Laid-Open No. 54-109828

Patent Document 2: Japanese Patent Application Laid-Open No. 4-204945

Patent Document 3: Japanese Patent Application Publication No. 1-46862

Patent Document 4: Japanese Patent Application Laid-Open No. 8-286374

DISCLOSURE OF INVENTION

Problem to be Solved by the Invention

The present invention has been made in order to solve the above conventional problems. An object of the present invention is to provide a positive-type photosensitive resin composition for electronic materials, which is excellent in reliability and has a film adhesion effect, particularly the film adhesion effect under a harsh condition such as heating and applying pressure without corroding copper or a copper alloy in a metal wiring or a metal layer, a method for producing patterns, and electronic parts. Another object of the present invention is to provide a positive-type photosensitive resin composition for electronic materials, which has a residual film prevention effect in addition to the above effect and is also good in sensitivity, a method for producing patterns, and electronic parts.

Means for Solving Problem

As a result of an extensive study in the light of the above circumstance, the present inventors have found that the above various problems can be solved by containing (C) a tetrazole derivative and (D) a compound which generates an acid by light in a positive-type photosensitive resin composition containing (A) a polybenzoxazole precursor and (B) a solvent.

That is, the positive-type photosensitive resin composition according to the present invention includes (A) the polybenzoxazole precursor having the structure represented by the following general formula (I):

wherein X represents a bivalent organic group, Y represents a tetravalent organic group, $R_1$ represents a hydrogen atom or a monovalent organic group, and m represents an integer of 2 to 500 and represents a repeating unit number of the polymer, (B) the solvent, (C) the tetrazole derivative, and (D) the compound which generates the acid by the light.

In the positive-type photosensitive resin composition according to the present invention, both end portions of the (A) polybenzoxazole precursor represented by the general formula (I) have a cyclic bond not having a reactive unsaturated bond, a reactive unsaturated bond or an acyclic saturated bond, respectively.

In the positive-type photosensitive resin composition according to the present invention, X and Y in the (A) the polybenzoxazole precursor represented by the general formula (I) are one or two or more cyclic aliphatic groups or aromatic groups, respectively, and the two or more cyclic aliphatic groups or aromatic groups are mutually bound via a single bond, an organic group or at least one heteroatom selected from the group consisting of oxygen, sulfur, nitrogen and silicon.

In the positive-type photosensitive resin composition according to the present invention, the (D) the compound which generates the acid by the light is an o-quinone diazide compound.

The method for producing the pattern according to the present invention includes the steps of: applying and drying the positive-type photosensitive resin composition on a support substrate; exposing the photosensitive resin film obtained by the applying and drying to make a predetermined pattern; developing the photosensitive resin film after the exposure using an alkaline aqueous solution; and treating the photosensitive resin film after the development with heat.

The electronic parts according to the present invention has a layer of the pattern obtained by the method for producing the pattern.

Effect of the Invention

The positive-type photosensitive resin composition according to the present invention has the good adhesiveness of the film, particularly the good film adhesion effect under the harsh condition such as heating and applying the pressure, and also has the good sensitivity without corroding the copper and copper alloy in the metal wiring and the metal layer. It also has the residual film prevention effect in addition to the above effect, also has the good sensitivity and is excellent in reliability.

According to the method for producing the pattern according to the present invention, the pattern having a high resolution and a good shape is obtained by using the positive-type photosensitive resin composition.

Furthermore, the electronic parts according to the present invention have the relief pattern which has the good shape and is excellent in adhesiveness and heat resistance, and have the high reliability.

EXPLANATIONS OF LETTERS OR NUMERALS

1 Semiconductor substrate
2 Protective film
3 First conductor layer
4 Interlayer insulation film layer
5 Photosensitive resin layer
6A, 6B, 6C Windows
7 Second conductor layer
8 Surface protective film layer

BEST MODES FOR CARRYING OUT THE INVENTION

Embodiments of the positive-type photosensitive resin composition, the method for producing the pattern and the electronic parts according to the present invention will be described in detail below based on the drawings. The present invention is not limited by the following embodiments.

[Positive-Type Photosensitive Resin Composition]

The positive-type photosensitive resin composition according to the present invention includes (A) the polybenzoxazole precursor having the structure represented by the following general formula (I):

wherein X represents a bivalent organic group, Y represents a tetravalent organic group, $R_1$ represents a hydrogen atom or a monovalent organic group, and m represents an integer of 2 to 500 and represents a repeating unit number of the polymer, (B) the solvent, (C) a nitrogen-containing heterocyclic compound, and (D) the compound which generates the acid by the light.

(A) Polybenzoxazole Precursor

Examples of the (A) polybenzoxazole precursor (hereinafter referred to as a "component (A)) in the present invention may include precursors obtained by reacting dicarboxylic acid with bisaminophenol. These polymers have the acidic functional group such as phenolic hydroxyl group and/or a derivatized substituent thereof in their structure.

The polybenzoxazole precursor is one having the structure represented by the general formula (I), because a good film property can be obtained.

(I)

In the formula, X represents a bivalent organic group, Y represents a tetravalent organic group, $R_1$ represents a hydrogen atom or a monovalent organic group, and m represents an integer of 2 to 500 and represents a repeating unit number of the polymer.

X in the above general formula (I) is the bivalent organic group, and is an aliphatic or aromatic group having a straight, branched or cyclic structure.

The aliphatic group may include alkyl chains, cyclopentyl rings, cyclohexyl rings, cyclooctyl rings, bicyclo rings or the like, and may have a substituent(s) thereon. Skeletons of these aliphatic groups may contain the heteroatom(s) such as oxygen, sulfur, nitrogen and silicon, or the organic group, e.g., ketone, ester and amide. Two or more aliphatic groups may be bound via a single bond or the heteroatom(s) such as oxygen, sulfur, nitrogen and silicon, or the organic group, e.g., ketone, ester, amide and alkylidene (including those where hydrogen atom(s) has been substituted with halogen atom(s) such as fluorine atom(s)).

Examples of the above aromatic groups may include benzene rings, naphthalene rings or the like. These aromatic groups may have substituent(s) thereon, and may contain the heteroatoms such as oxygen, sulfur, nitrogen and silicon in their substituents. Two or more aromatic groups may be bound via the single bond or the heteroatom(s) such as oxygen, sulfur, nitrogen and silicon, or the organic group, e.g., ketone, ester, amide and alkylidene (including those where hydrogen atom(s) has been substituted with halogen atom(s) such as fluorine atom(s)).

For synthesizing the polybenzoxazole precursor represented by the above general formula (I), the method of using dicarboxylic acid having X in the above general formula (I) is generally known.

As the dicarboxylic acid compound having the organic group X, examples of aliphatic dicarboxylic acid compounds may include malonic acid, methylmalonic acid, dimethylmalonic acid, butylmalonic acid, succinic acid, glutaric acid, 2,2-dimethylglutaric acid, adipic acid, itaconic acid, maleic acid, tetrafluoromaleic acid, diglycolic acid, 1,1-cyclobutanedicarboxylic acid, 1,2-cyclopentanedicarboxylic acid, 3,3-tetramethyleneglutaric acid, camphor acid, 1,2-cyclohexanedicarboxylic acid, 1,3-cyclohexanedicarboxylic acid, 1,4-cyclohexanedicarboxylic acid, 1,3-adamantanedicarboxylic acid, 5-norbornene-2,3-dicarboxylic acid, 1,2-phenylenediacetic acid, 1,3-phenylenediacetic acid, 1,4-phenylenediacetic acid and perfluorosuberic acid.

Further, as the dicarboxylic acid compound having the organic group X, aromatic ones are preferable in terms of heat resistance. Examples of aromatic dicarboxylic acid compounds may include phthalic acid, 3-fluorophthalic acid, 4-fluorophthalic acid, 3,4,5,6-tetrafluorophthalic acid, isophthalic acid, 2-fluoroisophthalic acid, 4-fluoroisophthalic acid, 5-fluoroisophthalic acid, 2,4,5,6-tetrafluoroisophthalic acid, terephthalic acid, 2,2-bis(4-carboxyphenyl)propane, 2,2-bis(4-carboxyphenyl)hexafluoropropane, 4,4'-dicarboxydiphenyl ether, 4,4'-dicarboxydiphenyl sulfone, 4,4'-dicarboxydiphenyl thioether, 4,4'-dicarboxybenzophenone, 2,2'-bis(trifluoromethyl)-4,4'-biphenyldicarboxylic acid, 5-nitroisophthalic acid, 1,4-naphthalenedicarboxylic acid, 2,6-naphthalenedicarboxylic acid and 4,4'-biphenyldicarboxylic acid. These dicarboxylic acids can be used alone or in combination of two or more.

Y in the general formula (I) is the tetravalent organic group, and is the aliphatic or aromatic group having the straight, branched or cyclic structure.

The aliphatic group may include alkyl chains, cyclopentyl rings, cyclohexyl rings, cyclooctyl rings, bicyclo rings or the like, and may have a substituent(s) thereon. Skeletons of these aliphatic groups may contain the heteroatom(s) such as oxygen, sulfur, nitrogen and silicon, or the organic group, e.g., ketone, ester and amide. Two or more aliphatic groups may be bound via the single bond or the heteroatom(s) such as oxygen, sulfur, nitrogen and silicon, or the organic group, e.g., ketone, ester, amide and alkylidene (including those where hydrogen atom(s) has been substituted with halogen atom(s) such as fluorine atom(s)).

Examples of the above aromatic groups may include benzene rings, naphthalene rings or the like. These aromatic groups may have substituent(s) thereon, and may contain the heteroatoms such as oxygen, sulfur, nitrogen and silicon in their substituents. Two or more aromatic groups may be bound via the single bond or the heteroatom(s) such as oxygen, sulfur, nitrogen and silicon, or the organic group, e.g., ketone, ester, amide and alkylidene (including those where hydrogen atom(s) has been substituted with halogen atom(s) such as fluorine atom(s)). As the organic group Y, the aromatic group is preferable in terms of heat resistance.

For synthesizing the polybenzoxazole precursor represented by the above general formula (I), the method of using bisaminophenol having Y in the formula is common.

The bisaminophenol compound having the above organic group Y is not particularly limited, but examples thereof may include 4,4'-diamino-3,3'-dihydroxybiphenyl, 2,2-bis(3-amino-4-hydroxyphenyl)propane, 2,2-bis(3-amino-4-hydroxyphenyl)hexafluoropropane, 3,3'-diamino-4,4'-dihydroxydiphenyl ether, 3,3'-diamino-4,4'-dihydroxydiphenyl sulfone, 3,3'-diamino-4,4'-dihydroxydiphenyl thioether, 3,3'-diamino-4,4'-dihydroxybenzophenone and 1,4-diamino-2,5-dihydroxybenzene. These bisaminophenol compounds are used alone or in combination of two or more.

The polybenzoxazole precursor represented by the above general formula (I) can be synthesized by reacting an active ester compound or an acid halide compound derived from dicarboxylic acid having the organic group X with a diamino compound having the organic group Y in an organic solvent.

When the polybenzoxazole precursor represented by the above general formula (I) is synthesized, an equivalent ratio of dicarboxylic acid having the organic group X to the diamino compound having the organic group Y is preferably 0.6<X/Y<1.5. When the equivalent ratio of dicarboxylic acid having the organic group X to the diamino compound having the organic group Y is out of the above range, a weight average molecular weight becomes small and the film property is reduced.

Also as described later, by changing the equivalent ratio within this range, it is possible to make the both ends of the resulting polybenzoxazole precursor the amino groups or carboxyl groups. Furthermore by introducing the functional group into the amino group or the carboxyl group, it is possible to make the both ends of the polybenzoxazole precursor the groups having the cyclic bond having no reactive unsaturated bond, the reactive unsaturated bond or the acyclic saturated bond.

By introducing the functional group into $R_1$ in the general formula (I), it becomes possible to control solubility upon development and process the pattern utilizing a photoreac- tion. By partially introducing these functional groups, it is also possible to control an alkaline solubility.

The method of introducing the functional group into $R_1$ in the general formula (I) may include the method of introducing via an ether bond or an ester bond. The specific method for its introduction may include an addition reaction utilizing a deacidification halogen reaction with a halogen compound or an acid halide compound having $R_1$ as the substituent, or an addition reaction with vinyl ether. $R_1$ may contain the heteroatom(s) such as oxygen, sulfur, nitrogen and silicon, or the organic group, e.g., ketone, ester, amide and alkylidene (including those where hydrogen atom(s) has been substituted with halogen atom(s) such as fluorine atom(s)) in its skeleton.

The functional group which is preferable for controlling the solubility well may include the functional groups having 1 to 15 carbon atoms, and examples thereof may include, but are not necessarily limited to, methyl group, ethyl group, propyl group, isopropyl group, n-butyl group, s-butyl group, t-butyl group, cyclopropyl group, cyclobutyl group, cyclopentyl group, cyclohexyl group, cyclohexylmethyl group, cyclopropenyl group, cyclobutynyl group, cyclopentynyl group, cyclohexenyl group, norbornyl group, norbornenyl group, adamantyl group, benzyl group, p-nitrobenzyl group, trifluoromethyl group, methoxyethyl group, ethoxyethyl group, methoxymethyl group, ethoxymethyl group, methoxyethoxymethyl group, benzoxymethyl group, ethoxytetrahydropyranyl group, tetrahydrofuranyl group, 2-trimethylsilylethoxymethyl group, trimethylsilyl group, t-butyldimethylsilyl group, 3-oxocyclohexyl group, 9-fluorenylmethyl group, phenyl group, toluoyl group, xylyl group, 9,10-dihydroanthranil group, trimethylphenyl group, pentamethylphenyl group, biphenylyl group, terphenylyl group, quarterphenylyl group, dimethylbiphenylyl group, naphthalenyl group, methylnaphthalenyl group, fluorenyl group, fluorophenyl group, fluorobiphenylyl group, isopropylidenebiphenylyl group, tetrafluoroisopropylidenebiphenylyl group, benzylphenyl ether group, phenyl ether group, methoxybiphenylyl group, dimethoxybiphenylyl group, methoxynaphthalenyl group, dimethoxynaphthalenyl group and nitrophenyl group.

When the equivalent ratio of dicarboxylic acid having the organic group X to the diamino compound having the organic group Y in the general formula (I) is 0.6<X/Y<1, the both end groups of the resulting polybenzoxazole precursor are amino groups. When the photosensitive resin composition contains the compound (D) which generates the acid by the light as described later, if the amino group at the end portion is primary amine, the stability of the photosensitive resin composition is deteriorated due to a side reaction. Thus, it is more preferable for obtaining the stability of the photosensitive resin composition that at least one of two hydrogen atoms on the amino group is substituted with another atom or another functional group. It is more preferable for obtaining the sufficient stability that a substitution rate thereof is in the range of 30 to 100%.

As the end portions of the polybenzoxazole precursor derived from the amino group, those having the structure represented by the following general formula (II) are preferable because an excellent cured resin nature is obtained.

(II)

In the general formula (II), $R_2$ represents a monovalent organic group preferably having 1 to 20 carbon atoms. Z represents an oxygen, sulfur or nitrogen atom. When Z represents the oxygen or sulfur atom, n represents 1, and when Z represents the nitrogen atom, n represents 2.

Examples of $R_2$ may include, but are not necessarily limited to, organic groups such as methyl group, ethyl group, propyl group, isopropyl group, n-butyl group, s-butyl group, t-butyl group, cyclopropyl group, cyclobutyl group, cyclopentyl group, cyclohexyl group, cyclohexylmethyl group, cyclopropenyl group, cyclobutynyl group, cyclopentynyl group, cyclohexenyl group, norbornyl group, norbornenyl group, adamantyl group, benzyl group, p-nitrobenzyl group, trifluoromethyl group, methoxyethyl group, ethoxyethyl group, methoxymethyl group, ethoxymethyl group, methoxyethoxymethyl group, benzoxymethyl group, ethoxytetrahydropyranyl group, tetrahydrofuranyl group, 2-trimethylsilylethoxymethyl group, trimethylsilyl group, t-butyldimethylsilyl group, 3-oxocyclohexyl group, 9-fluorenylmethyl group, phenyl group, toluoyl group, xylyl group, 9,10-dihydroanthranil group, trimethylphenyl group, pentamethylphenyl group, biphenylyl group, terphenylyl group, quarterphenylyl group, dimethylbiphenylyl group, naphthalenyl group, methylnaphthalenyl group, fluorenyl group, fluorophenyl group, fluorobiphenylyl group, isopropylidenebiphenylyl group, tetrafluoroisopropylidenebiphenylyl group, benzylphenyl ether group, phenyl ether group, methoxybiphenylyl group, dimethoxybiphenylyl group, methoxynaphthalenyl group, dimethoxynaphthalenyl and nitrophenyl group.

$R_3$ represents an aliphatic group or aromatic group having the straight, branched or cyclic structure. This structure is obtained by reacting acid anhydride having $R_3$ with amine. This acid anhydride may include, but is not necessarily limited to, succinic anhydride, glutaric anhydride, 2,2-dimethylglutaric anhydride, maleic anhydride, 1,2-cyclopentanedicarboxylic anhydride, 1,2-cyclohexanedicarboxylic anhydride, 5-norbornene-2,3-dicarboxylic anhydride, phthalic anhydride, 3-fluorophthalic anhydride, 4-fluorophthalic anhydride and 3,4,5,6-tetrafluorophthalic anhydride.

The aliphatic group in $R_3$ may include alkyl chains, cyclopentyl rings, cyclohexyl rings, cyclooctyl rings, bicyclo rings or the like, and may have a substituent(s) thereon. Skeletons of these aliphatic groups may contain the heteroatom(s) such as oxygen, sulfur, nitrogen and silicon, or the organic group, e.g., ketone, ester, amide and alkylidene (including those where hydrogen atom(s) has been substituted with halogen atom(s) such as fluorine atom(s)).

The aromatic group in $R_3$ may include benzene rings, naphthalene rings or the like. These aromatic groups may have substituent(s) thereon, and the substituent may contain the heteroatoms such as oxygen, sulfur, nitrogen and silicon. Two or more aromatic groups may be bound via the single bond or the heteroatom(s) such as oxygen, sulfur, nitrogen and silicon, or the organic group, e.g., ketone, ester, amide and alkylidene (including those where hydrogen atom(s) has been substituted with halogen atom(s) such as fluorine atom(s)).

When these $R_2$ and $R_3$ are classified by the presence or absence of the reactive unsaturated bond (carbon-carbon unsaturated bond) and then classified by having the cyclic structure or not, they can be classified into the following (1) to (4).

(1) The group having the reactive unsaturated bond and the cyclic structure may include cyclopropenyl group, cyclobutynyl group, cyclopentynyl group, cyclohexenyl group, norbornenyl group, and groups shown in the second right in the above general formula (II) having an imide structure and derived from maleic anhydride. The groups not having the reactive unsaturated bond in the cyclic structure but having the reactive unsaturated bond in the site other than the cyclic structure, for example the groups having the benzene ring and the reactive unsaturated double bond out of the benzene ring are included in this category.

(2) The groups having the reactive unsaturated bond and the acyclic structure may include the groups having the structure shown in the rightmost in the above general formula (II) and derived from maleic anhydride.

(3) The groups not having the reactive unsaturated bond and having the cyclic structure may include aliphatic hydrocarbon groups having the cyclic structure, such as cyclopropyl group, cyclobutyl group, cyclopentyl group, cyclohexyl group, cyclohexylmethyl group, norbornyl group, adamantyl group, ethoxytetrahydropyranyl group, tetrahydrofuranyl group, and 3-oxocyclohexyl groups; aromatic hydrocarbon groups having the cyclic structure, such as benzyl group, p-nitrobenzyl group, benzoxymethyl group, 9-fluorenylmethyl group, phenyl group, toluoyl group, xylyl group, 9,10-dihydroanthranil group, trimethylphenyl group, pentamethylphenyl group, biphenylyl group, terphenylyl group, quarterphenylyl group, dimethylbiphenylyl group, naphthalenyl group, methylnaphthalenyl group, fluorenyl group, fluorophenyl group, fluorobiphenylyl group, isopropylidenebiphenylyl group, tetrafluoroisopropylidenebiphenylyl group, benzylphenyl ether group, phenyl ether group, methoxybiphenylyl group, dimethoxybiphenylyl group, methoxynaphthalenyl group, dimethoxynaphthalenyl group, and nitrophenyl group, and the groups shown in the second right in the above general formula (II) having the cyclic structure including an imide structure and derived from succinic anhydride, glutaric anhydride, 2,2-dimethylglutaric anhydride, 1,2-cyclopentanedicarboxylic anhydride, 1,2-cyclohexanedicarboxylic anhydride, 5-norbornene-2,3-dicarboxylic anhydride, phthalic anhydride, 3-fluorophthalic anhydride, 4-fluorophthalic anhydride, and 3,4,5,6-tetrafluorophthalic anhydride.

(4) The groups not having the reactive unsaturated bond and having the acyclic structure (acyclic saturated bond) may include methyl group, ethyl group, propyl group, isopropyl group, n-butyl group, s-butyl group, t-butyl group, trifluoromethyl group, methoxyethyl group, ethoxyethyl group, methoxymethyl group, ethoxymethyl group, methoxyethoxymethyl group, 2-trimethylsilylethoxymethyl group, trimethylsilyl group, t-butyldimethylsilyl group, and the groups having the structure shown in the rightmost in the above general formula (II) and derived from succinic anhydride, glutaric anhydride and 2,2-dimethylglutaric anhydride.

In the present invention, the groups having the reactive unsaturated bond or the acyclic saturated bond refer to the groups included in the above (1), (2) and (4). The groups in the above (3) are the groups having the cyclic bond not having the reactive unsaturated bond, i.e., the groups having the cyclic saturated bond not having the reactive unsaturated bond.

Among them, the cyclic bond not having the reactive unsaturated bond (3) and the group having the acyclic saturated bond (4) are preferable in terms of stability.

When the equivalent ratio of dicarboxylic acid having the organic group X to the diamino compound having the organic group Y in the general formula (I) is 1<X/Y<1.5, the both end portions of the resulting polybenzoxazole precursor are the carboxyl groups. The carboxyl group can be substituted with the other functional group.

As the specific method for introducing the functional group into the carboxyl group, the end portion can be substituted by adding an amino compound upon synthesizing the polybenzoxazole precursor.

Examples of the amino compound may include, but are not necessarily limited to, aliphatic amine such as ethylamine, propylamine, isopropylamine, butylamine, isobutylamine, t-butylamine, diethylamine, dipropylamine, diisopropylamine, dibutylamine, cyclopropylamine, cyclobutylamine, cyclopentylamine, cyclohexylamine and cyclohexylmethylamine, and aromatic amine such as aniline, o-toluidine, m-toluidine, p-toluidine, o-aminophenol, m-aminophenol and p-aminophenol.

The molecular weight of the polybenzoxazole precursor represented by the general formula (I) is preferably 5,000 to 80,000 and more preferably 10,000 to 40,000 as the weight average molecular weight. The weight average molecular weight can be obtained by measuring by a gel permeation chromatography method and converting using a standard curve of standard polystyrene.

(B) Solvent

As the above (B) solvent (hereinafter referred to as a "component (B)") in the present invention, polar solvents such as γ-butylolactone, N-methyl-2-pyrrolidone, N-acetyl-2-pyrrolidone, N,N-dimethylacetamide, dimethylsulfoxide, hexamethylphosphortriamide, dimethylimidazolidinone and N-acetyl-ε-caprolactam are preferable. In addition to these polar solvents, ketones, esters, lactones, ethers, halogenated hydrocarbons and hydrocarbons, e.g., acetone, diethyl ketone, methyl ethyl ketone, methyl isobutyl ketone, cyclohexanone, methyl acetate, ethyl acetate, butyl acetate, diethyl oxalate, diethyl malonate, diethyl ether, ethylene glycol dimethyl ether, diethylene glycol dimethyl ether, propylene glycol monomethyl ether, propylene glycol monomethyl ether acetate, tetrahydrofuran, dichloromethane, 1,2-dichloroethane, 1,4-dichlorobutane, trichloroethane, chlorobenzene, o-dichlorobenzene, hexane, heptane, octane, benzene, toluene and xylene can also be used. These organic solvents are used alone or in combination of two or more. But, the type thereof is not particularly limited as long as they dissolve the photosensitive resin composition according to the present invention. Generally, the solvent is used at 40 to 90% by weight in the photosensitive resin composition.

(C) Tetrazole Derivative

The above (C) tetrazole derivative (hereinafter referred to as a "component (C)") in the present invention may include, but is not necessarily limited to, 1H-tetrazole, 5-methyl-1H-tetrazole, 5-phenyl-1H-tetrazole, 5-amino-1H-tetrazole, 1-methyl-1H-tetrazole and 5,5'-bis-1H-tetrazole.

These components (C) are used alone or in combination of two or more. An amount of the component (C) to be used is typically 0.1 to 10 parts by weight per one component (C) relative to 100 parts by weight of the component (A). When two or more components (C) are combined, the amount of the components (C) is 0.1 to 10 parts by weight and more preferably 0.2 to 5 parts by weight in sum total. When the amount is less than 0.1 parts by weight, the effect of enhancing the adhesiveness to the metal layer tends to be reduced. Even when it exceeds 10 parts by weight, the more enhancement of the adhesiveness can not be anticipated.

(D) Compound which Generates Acid by Light

In the photosensitive resin composition according to the present invention, (D) the compound which generates the acid by the light (hereinafter referred to as a "component (D)") is added in addition to the above components (A) to (C). The component (D) is a photosensitizing agent and has the function to generate the acid to increase the solubility of a light-irradiated portion in the alkaline aqueous solution. The component (D) used in the present invention can be the component which generates the acid by the light, and specific examples thereof may include o-quinone diazide compounds, aryl diazonium salts, diaryl iodonium salts and triaryl sulfonium salts.

The above o-quinone diazide compound can be obtained by condensing o-quinone diazide sulfonyl chlorides with a hydroxy compound or an amino compound in the presence of a de-hydrochloric acid agent.

Examples of the above o-quinone diazide sulfonyl chlorides may include benzoquinone-1,2-diazide-4-sulfonyl chloride, naphthoquinone-1,2-diazide-5-sulfonyl chloride and naphthoquinone-1,2-diazide-4-sulfonyl chloride.

As the compound which is reacted with the above o-quinone diazide sulfonyl chlorides, the hydroxy compound is preferable in terms of photosensitive property. Examples of this hydroxy compound may include, but are not necessarily limited to, hydroquinone, resorcinol, pyrogallol, bisphenol A, bis(2-hydroxyphenyl)methane, bis(4-hydroxyphenyl)methane, 2-hydroxyphenyl-4'-hydroxyphenylmethane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 2-(4-hydroxyphenyl)-2-[4-[1,1-bis(4-hydroxyphenyl)ethyl]phenyl]propane, 4b,5,9b,10-tetrahydro-1,3,6,8-tetrahydroxy-5,10-dimethylindeno[2,1-a]indene, tris(4-hydroxyphenyl)methane and 1,1,1-tris(4-hydroxyphenyl)ethane.

Examples of the aryl diazonium salt, the diaryl iodonium salt and the triaryl sulfonium salt may include, but are not necessarily limited to, benzenediazonium p-toluenesulfonate, diphenyliodonium 9,10-dimethoxyanthracene-2-sulfonate, tris(4-t-butylphenyl)sulfonium trifluoromethanesulfonate, N-trifluoromethanesulfonyl naphthalimide, p-nitrobenzyl-9,10-dimethoxyanthracene-2-sulfonate and 4-methoxy-α-[[[(4-methylphenyl)sulfonyl]oxy]imino]benzene acetonitrile.

These components (D) are used alone or in combination of two or more. The amount of the component (D) to be used is typically 0.1 to 40 parts by weight per one component (D) relative to 100 parts by weight of the component (A). When two or more components (D) are combined, the amount of the components (D) is 0.1 to 40 parts by weight and more preferably 1 to 20 parts by weight in sum total. When the amount is less than 0.1 parts by weight, the effect as the photosensitizing agent tends not to be observed sufficiently. When it exceeds 40 parts by weight, a bottom tends not to be exposed sufficiently when a resin layer is exposed.

(E) Other Components

In addition to the above essential components (A) to (D), a silane coupling agent can be used as an adhesiveness enhancing agent for a silicon substrate in the positive-type photosensitive resin composition according to the present invention. Also, a compound obtained by making Y in the above general formula (I) one derived from diaminosiloxane and modifying it into a base polymer can be used as the adhesiveness enhancing agent for the silicon substrate. Furthermore, a dissolution inhibitor and a stabilizing agent may be combined depending on the purpose.

As the above silane coupling agent, alkoxysilanes are preferable in terms of reactivity, and examples thereof may include, but are not necessarily limited to, vinyltrimethoxysilane, N-(2-aminoethyl)-3-aminopropylmethyltrimethoxysilane, 3-amonopropyltrimethoxysilane, N-methyl-3-aminopropyltrimethoxysilane, 3-glycidoxypropyltrimethoxysilane, 2-(3,4-epoxycyclohexyl)ethyltrimethoxysilane, 3-methacryloxypropyltrimethoxysilane, 3-mercaptopropyltrimethoxysilane, N-(1,3-dimethylbutylidene)-3-(triethoxysilyl)-1-propaneamine, N,N-bis(3-trimethoxysilyl)propyl)ethylenediamine, N-(3-trimethoxysilylpropyl)pyrrol, 3-ureidopropyltrimethoxysilane, 3-ureidopropyltriethoxysilane, N-(3-triethoxysilylpropyl)-t-butyl carbamate, N-phenyl-3-aminopropyltrimethoxysilane, bis(2-hydroxyethyl)-3-aminopropyltriethoxysilane, 3-isocyanatopropyltriethoxysilane and (furfuryloxymethyl)triethoxysilane.

A dissolution accelerator can also be used for the purpose of enhancing a dissolution contrast. Examples of the dissolution accelerator may include compounds having an acid functional group. As the acid functional group, phenolic hydroxyl groups, carboxyl groups and sulfonyl groups are preferable. Examples of such a dissolution accelerator may include, but are not necessarily limited to, bis(2-hydroxyphenyl)methane, bis(4-hydroxyphenyl)methane, 2-hydroxyphenyl-4'-hydroxyphenylmethane, bis(2-hydroxy-4-methyl)methane, 4,4'-dihydroxydiphenyl ether, 2,2-bis(4-hydroxy-3-methylphenyl)propane, 4,4-(1-phenylethylidene)bisphenol, 5,5-(1-methylethylidene)bis(1,1-(biphenyl)-2-ol), tris(4-hydroxyphenyl)methane, 1,1,1-tris(4-hydroxyphenyl)ethane, 2,6-bis((2-hydroxy-5-methylphenyl)methyl)-4-methylphenol, 4,4-[1-[4-[1-(4-hydroxyphenyl)-1-methylethyl]phenyl]ethylidene]bisphenol, 4,4'-dihydroxydiphenyl sulfone, 2-hydroxy-5-methyl-1,3-benzenedimethylol, 3,3-methylenebis(2-hydroxy-5-methylbenzenemethanol), bis[4-hydroxy-3,5-bis(hydroxymethyl)]methane, 2,2-bis[4-hydroxy-3,5-bis(hydroxymethyl)propane, 2,2-bis[4-hydroxy-3,5-bis(hydroxymethyl)]hexafluoropropane, salicylic acid, malonic acid, methylmalonic acid, dimethylmalonic acid, butylmalonic acid, succinic acid, glutaric acid, 2,2-dimethylglutaric acid, adipic acid, itaconic acid, maleic acid, tetrafluoromaleic acid, diglycolic acid, 1,1-cyclobutanedicarboxylic acid, 1,2-cyclopentanedicarboxylic acid, 3,3-tetramethyleneglutaric acid, camphor acid, 1,2-cyclohexanedicarboxylic acid, 1,3-cyclohexanedicarboxylic acid, 1,4-cyclohexanedicarboxylic acid, 1,3-adamantanedicarboxylic acid, 5-norbornene-2,3-dicarboxylic acid, 1,2-phenylenediacetic acid, 1,3-phenylenediacetic acid, 1,4-phenylenediacetic acid, perfluorosuberic acid, 2-fluoroisophthalic acid, 4-fluoroisophthalic acid, 5-fluoroisophthalic acid, 3-fluorophthalic acid, 4-fluorophthalic acid, 2,4,5,6-tetrafluorophthalic acid, 3,4,5,6-tetrafluorophthalic acid, 4,4'-hexafluoroisopropylidenediphenyldicarboxylic acid, 2,2'-bis(trifluoromethyl)-4,4'-biphenyldicarboxylic acid, terephthalic acid, isophthalic acid, 4,4'-oxydiphenyldicarboxylic acid, 5-nitroisophthalic acid, 1,4-naphthalenedicarboxylic acid, 2,6-naphthalenedicarboxylic acid, 4,4-biphenyldicarboxylic acid and 4-hydroxybenzenesulfonic acid. These dissolution accelerators are used alone or in combination of two or more.

[Method for Producing Patterns]

Subsequently, the method for producing the patterns using the positive-type photosensitive resin composition according to the present invention will be described.

First, the photosensitive resin composition according to the present invention is applied on the support substrate which is the substrate such as a silicon wafer, a metal substrate or a ceramic substrate by a dipping method, a spraying method, a screen printing method or a rotation application method. Then, the resulting photosensitive resin coating film is heated and dried appropriately to make the photosensitive resin coating film having no adhesiveness. A photoresist is applied onto this photosensitive resin coating film, and an active light ray or a chemical ray is irradiated thereto as an exposure treatment through a mask on which a desired pattern has been depicted.

As the active light ray or the chemical ray to be irradiated, a contact/proximity exposure apparatus using a ultrahigh pressure mercury lamp, a mirror projection exposure apparatus, an i-ray stepper, a g-ray stepper, and additionally ultraviolet light, visible light, X-ray and electron beam can be used. Subsequently, a post-exposure baking (PEB) is performed if necessary, and the development is performed. The desired positive pattern can be obtained by dissolving and removing an exposed portion with a developing solution.

The alkaline aqueous solution is used as the developing solution. For example, the aqueous solution of alkali metal hydroxide such as potassium hydroxide and sodium hydroxide, the aqueous solutions of quaternary ammonium hydroxide such as tetramethylammonium hydroxide tetraethylammonium hydroxide and choline, and amine aqueous solution such as ethanolamine, propylamine and ethylenediamine are used. After the development, a rinse with water or a poor solvent is performed as needed. As a rinse solution, for example, methanol, ethanol, isopropyl alcohol, benzene, toluene, xylene, methyl cellosolve and water are used. Subsequently, the photoresist is removed, and the solvent or the solvent and the photosensitizing agent can be removed by heating the obtained pattern to obtain the stable and highly heat resistant polybenzoxazole pattern.

A temperature of the heating is preferably 150 to 500° C. and more preferably 200 to 400° C. Because when this heating temperature is lower than 150° C., a mechanical property and a thermal property of the film tend to be reduced and when it exceeds 500° C., the mechanical property and the thermal property of the film tend to be reduced.

A time period for heating is preferably 0.05 to 10 hours. When this heating time period is shorter than 0.05 hours, the mechanical property and the thermal property of the film tend to be reduced and when it exceeds 10 hours, the mechanical property and the thermal property of the film tend to be reduced.

[Electronic Parts]

The positive-type photosensitive resin composition and the method for producing the pattern according to the present invention can be used for the electronic parts in the semiconductor devices and the multilayer wiring plates. Specifically, they can be used for forming the surface protective film layer and the interlayer insulation film layer in the semiconductor devices and the interlayer insulation film layer in the multilayer wiring plates. The electronic parts according to the present invention is not particularly limited except that they have the surface protective film layer and/or the interlayer insulation film layer formed using the positive-type photosensitive resin composition, and can take the various structures. The electronic parts also include the semiconductor devices, the multilayer wiring plates and various electronic devices.

Subsequently, one example of steps for producing a semiconductor device which is one example of the electronic parts according to the present invention will be described below. FIGS. 1 to 5 are schematic cross sectional views explaining process charts for producing the semiconductor device of a multilayer wiring structure. FIG. 1 to FIG. 5 represent a series of steps from a first step to a fifth step.

In these figures, a semiconductor substrate 1 such as an Si substrate having a circuit element (not shown in the figures) is coated with a protective film 2 such as a silicon oxide film except for a predetermined portion of the circuit element, and a first conductor layer 3 is formed on the exposed circuit element. An interlayer insulation film layer 4 is formed on the semiconductor substrate 1 by a spin coating method (first step, FIG. 1).

Subsequently, a chlorinated rubber-based or phenol novolak-based photosensitive resin layer 5 is formed as a mask on the interlayer insulation film layer 4 by the spin coating method. A window 6A is provided by photolithography known publicly so that the interlayer insulation film layer in the predetermined portion is exposed (second step, FIG. 2).

The interlayer insulation film layer 4 exposed from the window 6A is selectively etched by a dry etching procedure using gas of oxygen or carbon tetrafluoride to open a window 6B. Then, the photosensitive resin layer 5 is completely removed using an etching solution which corrodes the photosensitive resin layer 5 alone without corroding the first conductor layer 3 exposed from the window 6B (third step, FIG. 3).

Figure 1:
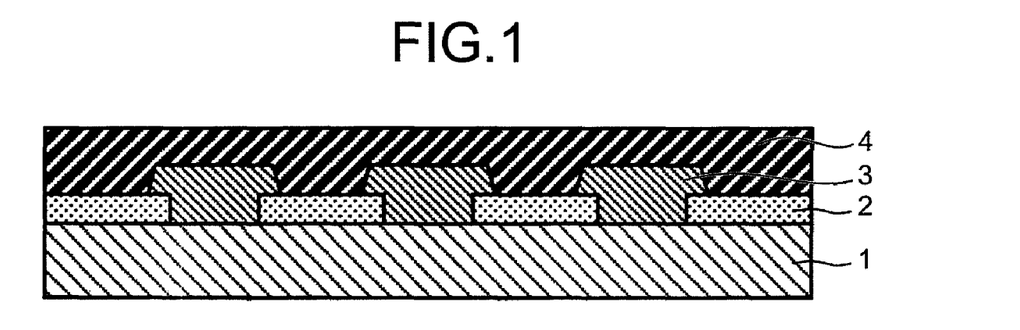
FIG. 1 is a schematic cross sectional view explaining a step for producing a semiconductor device having a multilayer wiring structure according to an embodiment of the present invention.
Figure 2:
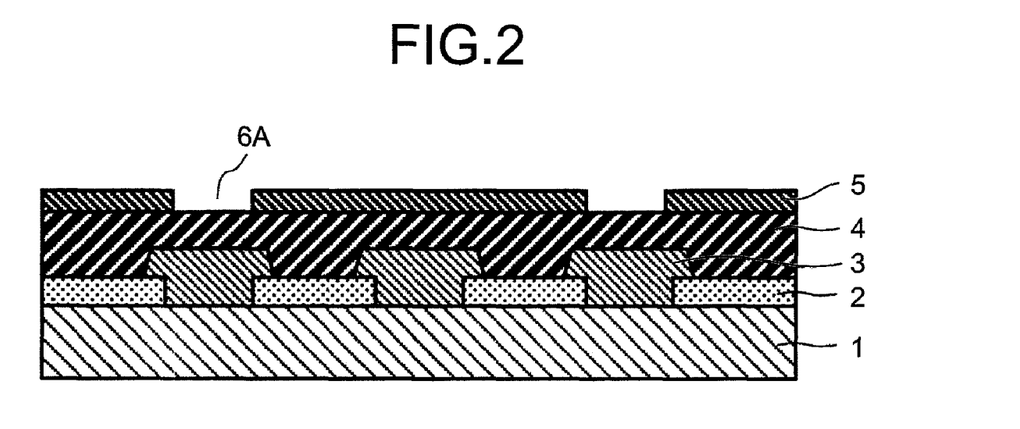
FIG. 2 is a schematic cross sectional view explaining a step for producing the semiconductor device having the multilayer wiring structure according to the embodiment of the present invention.
Figure 3:
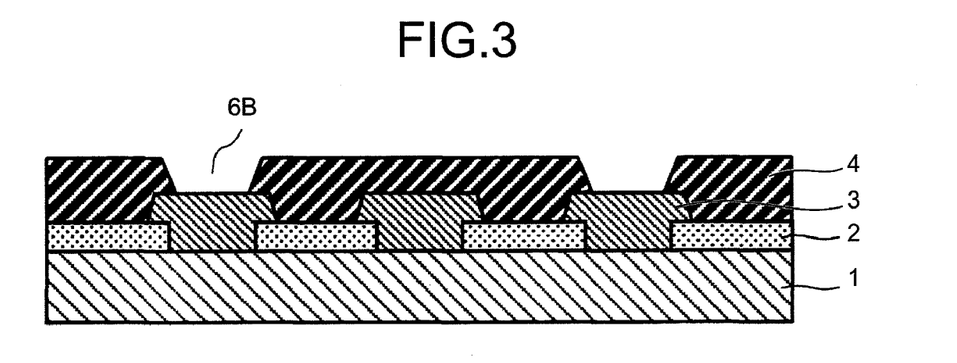
FIG. 3 is a schematic cross sectional view explaining a step for producing the semiconductor device having the multilayer wiring structure according to the embodiment of the present invention.
Figure 4:
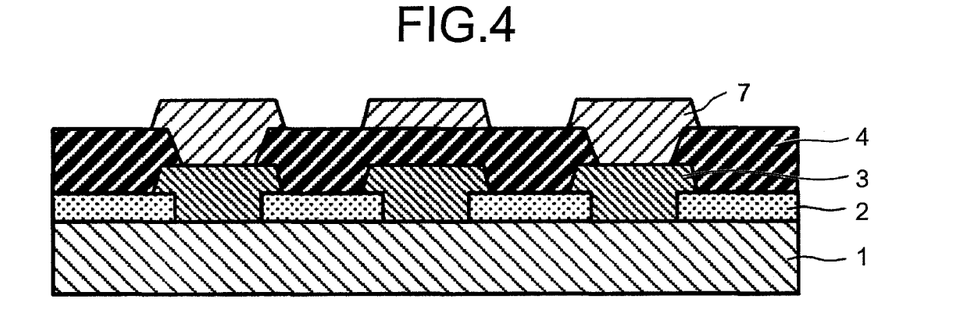
FIG. 4 is a schematic cross sectional view explaining a process for producing the semiconductor device having the multilayer wiring structure according to the embodiment of the present invention.
Figure 5:
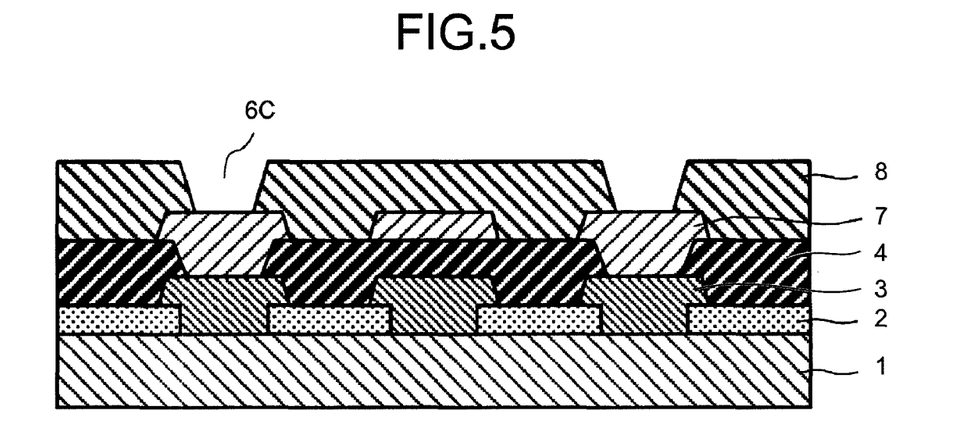
FIG. 5 is a schematic cross sectional view explaining a process for producing the semiconductor device having the multilayer wiring structure according to the embodiment of the present invention.

Furthermore, a second conductor layer 7 is formed using the photolithography known publicly, and electrically connected completely with the first conductor layer 3 (fourth step, FIG. 4). When the multilayer wiring structure having three or more layers is formed, the respective layers can be formed by repeating the above steps.

Subsequently, a surface protective film layer 8 is formed. In the example in FIGS. 1 to 5, the surface protective film 8 is formed by applying the photosensitive resin composition by the spin coating method followed by drying, irradiating the light from above the mask on which the pattern to form a window 6C in the predetermined portion has been depicted, and subsequently developing with the alkaline aqueous solution to form the pattern followed by heating (fifth step, FIG. 5). This surface protective film layer 8 protects the conductor layer from stress from an outside and α-ray. The resulting semiconductor device is excellent in reliability. In the above example, it is also possible to form the interlayer insulation film layer 4 using the positive-type photosensitive resin composition according to the present invention.

EXAMPLES

The present invention will be described more specifically based on the following Examples and Comparative Examples. The present invention is not limited to the following Examples.

Synthesis Example 1

In a flask which was a sealed reaction vessel equipped with a stirrer, a thermometer and a nitrogen introducing tube, 75 g of dry N-methylpyrrolidone and 12.9 g (0.05 mol) of 4,4'-diphenyl ether dicarboxylic acid were added, this flask was cooled to 5° C., then 11.9 g (0.1 mol) of thionyl chloride was dropped and the mixture was stirred for 30 minutes after dropping to yield a reaction solution A-1. Then, in another sealed reaction vessel equipped with the stirrer, the thermometer and the nitrogen introducing tube, 105 g of dry N-methylpyrrolidone, 22.0 g (0.06 mol) of 2,2-bis(3-amino-4-hydroxyphenyl)hexafluoropropane and 3.28 g (0.02 mol) of 5-norbornene-2,3-dicarboxylic anhydride (for forming polymer ends) were added, stirred and dissolved, then 15.8 g (0.2 mol) of pyridine was added, stirred and dissolved. This solution was cooled to 0° C., the reaction solution A-1 obtained earlier was dropped over 30 minutes, and then the mixture was stirred at room temperature for 30 minutes. This reaction mixture was treated with 2.0 L of ion-exchange water with agitating vigorously. A precipitated solid was further washed with ion-exchange water, dried on a filtering filter with aspirating and further dried under reduced pressure to yield a polymer P-1. A water content was 0.8% by weight, a weight average molecular weight was 22,800 and a dispersivity was 1.8 in this polymer.

Synthesis Example 2

In the flask which was the sealed reaction vessel equipped with the stirrer, the thermometer and the nitrogen introducing tube, 75 g of dry N-methylpyrrolidone and 12.9 g (0.05 mol) of 4,4'-diphenyl ether dicarboxylic acid were added, this flask was cooled to 5° C., then 11.9 g (0.1 mol) of thionyl chloride was dropped and the mixture was stirred for 30 minutes after dropping to yield the reaction solution A-1. Then, in another sealed reaction vessel equipped with the stirrer, the thermometer and the nitrogen introducing tube, 105 g of dry N-methylpyrrolidone, 22.0 g (0.06 mol) of 2,2-bis(3-amino-4-hydroxyphenyl)hexafluoropropane and 1.96 g (0.02 mol) of maleic anhydride (for forming the polymer ends) were added, stirred and dissolved, then 15.8 g (0.2 mol) of pyridine was added, stirred and dissolved. This solution was cooled to 0° C., the reaction solution A-1 obtained earlier was dropped over 30 minutes, and then the mixture was stirred at room temperature for 30 minutes. This reaction mixture was treated with 2.0 L of ion-exchange water with agitating vigorously. A precipitated solid was further washed with ion-exchange water, dried on the filtering filter with aspirating and further dried under reduced pressure to yield a polymer P-2. The water content was 1.0 by weight, the weight average molecular weight was 20,500 and the dispersivity was 1.8 in this polymer.

Synthesis Example 3

In the flask which was the sealed reaction vessel equipped with the stirrer, the thermometer and the nitrogen introducing tube, 100 g of dry N-methylpyrrolidone and 20.7 g (0.08 mol) of 4,4'-diphenyl ether dicarboxylic acid were added, this flask was cooled to 5° C., then 19.0 g (0.16 mol) of thionyl chloride was dropped and the mixture was stirred for 30 minutes after dropping to yield a reaction solution A-2. Then, in another sealed reaction vessel equipped with the stirrer, the thermometer and the nitrogen introducing tube, 105 g of dry N-methylpyrrolidone and 23.2 g (0.09 mol) of 2,2-bis(3-amino-4-hydroxyphenyl)propane were added, stirred and dissolved, 2.29 g (0.02 mol) of methanesulfonyl chloride (for forming the polymer ends) was added, stirred and dissolved, and then 25.3 g (0.32 mol) of pyridine was added, stirred and dissolved. This solution was cooled to 0° C., the reaction solution A-2 obtained earlier was dropped over 30 minutes, and then the mixture was stirred at room temperature for 30 minutes. This reaction mixture was treated with 2.0 L of ion-exchange water with agitating vigorously. A precipitated solid was further washed with ion-exchange water, dried on the filtering filter with aspirating and further dried under reduced pressure to yield a polymer P-3. The water content was 0.7% by weight, the weight average molecular weight was 20,800 and the dispersivity was 1.7 in this polymer.

Synthesis Example 4

In the flask which was the sealed reaction vessel equipped with the stirrer, the thermometer and the nitrogen introducing tube, 75 g of dry N-methylpyrrolidone and 10.3 g (0.04 mol) of 4,4'-diphenyl ether dicarboxylic acid and 17.2 g (0.01 mol) of 1,4-cyclohexanedicarboxylic acid were added, this flask was cooled to 5° C., then 11.9 g (0.1 mol) of thionyl chloride was dropped and the mixture was stirred for 30 minutes after dropping to yield a reaction solution A-3. Then, in another sealed reaction vessel equipped with the stirrer, the thermometer and the nitrogen introducing tube, 105 g of dry N-methylpyrrolidone, 22.0 g (0.06 mol) of 2,2-bis(3-amino-4-hydroxyphenyl)hexafluoropropane and 3.28 g (0.02 mol) of 5-norbornene-2,3-dicarboxylic anhydride (for forming the polymer ends) were added, stirred and dissolved, then 15.8 g (0.2 mol) of pyridine was added, stirred and dissolved. This solution was cooled to 0° C., the reaction solution A-3 obtained earlier was dropped over 30 minutes, and then the mixture was stirred at room temperature for 30 minutes. This reaction mixture was treated with 2.0 L of ion-exchange water with agitating vigorously. A precipitated solid was further washed with ion-exchange water, dried on the filtering filter with aspirating and further dried under reduced pressure to yield a polymer P-4. The water content was 0.8% by weight, the weight average molecular weight was 20,300 and the dispersivity was 1.8 in this polymer.

Synthesis Example 5

In the flask which was the sealed reaction vessel equipped with the stirrer, the thermometer and the nitrogen introducing tube, 75 g of dry N-methylpyrrolidone and 8.31 g (0.05 mol) of isophthalic acid were added, this flask was cooled to 5° C., then 11.9 g (0.1 mol) of thionyl chloride was dropped and the mixture was stirred for 30 minutes after dropping to yield a reaction solution A-4. Then, in another sealed reaction vessel equipped with the stirrer, the thermometer and the nitrogen introducing tube, 105 g of dry N-methylpyrrolidone, 22.0 g (0.06 mol) of 2,2-bis(3-amino-4-hydroxyphenyl)hexafluoropropane and 3.28 g (0.02 mol) of 5-norbornene-2,3-dicarboxylic anhydride (for forming the polymer ends) were added, stirred and dissolved, then 15.8 g (0.2 mol) of pyridine was added, stirred and dissolved. This solution was cooled to 0° C., the reaction solution A-4 obtained earlier was dropped over 30 minutes, and then the mixture was stirred at room temperature for 30 minutes. This reaction mixture was treated with 2.0 L of ion-exchange water with agitating vigorously. A precipitated solid was further washed with ion-exchange water, dried on the filtering filter with aspirating and further dried under reduced pressure to yield a polymer P-5. The water content was 0.7% by weight, the weight average molecular weight was 18,800 and the dispersivity was 1.8 in this polymer.

Synthesis Example 6

In the flask which was the sealed reaction vessel equipped with the stirrer, the thermometer and the nitrogen introducing tube, 100 g of dry N-methylpyrrolidone and 26.6 g (0.09 mol) of 4,4'-diphenyl ether dicarboxylic acid dichloride were added, stirred and dissolved to yield a solution A-5. Then, in another sealed reaction vessel equipped with the stirrer, the thermometer and the nitrogen introducing tube, 105 g of dry N-methylpyrrolidone, 2.18 g (0.02 mol) of m-aminophenol (for forming the polymer ends) and 20.7 g (0.08 mol) of 2,2-bis(3-amino-4-hydroxyphenyl)propane were stirred and dissolved. This solution was cooled to 0° C., the reaction solution A-5 obtained earlier was dropped over 30 minutes, and then the mixture was stirred at room temperature for 30 minutes. This reaction mixture was treated with 2.0 L of ion-exchange water with agitating vigorously. A precipitated solid was further washed with ion-exchange water, dried on the filtering filter with aspirating and further dried under reduced pressure to yield a polymer P-6. The water content was 0.7% by weight, the weight average molecular weight was 23,000 and the dispersivity was 1.7 in this polymer.

Synthesis Example 7

In the flask which was the sealed reaction vessel equipped with the stirrer, the thermometer and the nitrogen introducing tube, 75 g of dry N-methylpyrrolidone and 12.9 g (0.05 mol) of 4,4'-diphenyl ether dicarboxylic acid were added, this flask was cooled to 5° C., then 11.9 g (0.1 mol) of thionyl chloride was dropped and the mixture was stirred for 30 minutes after dropping to yield the reaction solution A-1. Then, in another sealed reaction vessel equipped with the stirrer, the thermometer and the nitrogen introducing tube, 105 g of dry N-methylpyrrolidone, 22.0 g (0.06 mol) of 2,2-bis(3-amino-4-hydroxyphenyl)hexafluoropropane and 2.09 g (0.02 mol) of cyclopropanecarbonyl chloride (for forming the polymer ends) were added, stirred and dissolved, then 15.8 g (0.2 mol) of pyridine was added, stirred and dissolved. This solution was cooled to 0° C., the reaction solution A-1 obtained earlier was dropped over 30 minutes, and then the mixture was stirred at room temperature for 30 minutes. This reaction mixture was treated with 2.0 L of ion-exchange water with agitating vigorously. A precipitated solid was further washed with ion-exchange water, dried on the filtering filter with aspirating and further dried under reduced pressure to yield a polymer P-7. The water content was 0.8% by weight, the weight average molecular weight was 19,800 and the dispersivity was 1.7 in this polymer.

Example 1

In a three-necked flask equipped with the stirrer, the thermometer and the nitrogen introducing tube, 10 g of the polymer P-1 obtained in Synthesis Example 1 and 15 g of γ-butylolactone were mixed, stirred and dissolved, and further 1.50 g of a compound obtained by reacting 2-(4-hydroxyphenyl)-2-[4-[1,1-bis(4-hydroxyphenyl)ethyl]phenyl]propane with naphthoquinone-1,2-diazido-5-sulfonyl chloride at a molar ratio of 1/2.5, 0.10 g of 1H-tetrazole and 0.20 g of bis(2-hydroxyethyl)-3-aminopropyltriethoxysilane were added thereto, and the mixture was stirred and dissolved at room temperature for 24 hours, and then filtrated to obtain a positive-type photosensitive resin composition solution. This positive-type photosensitive resin composition solution was spin-coated on a wafer (hereinafter referred to as a "Cu wafer") obtained by forming a TiN film having a film thickness of 200 angstroms on a 5-inch silicon substrate by sputtering and forming a Cu film having the film thickness of 5000 angstroms thereon by sputtering, and heated and dried to form a coating film of 10 μm. Subsequently the coating film was exposed through a mask at an exposure amount of 700 mJ/cm$^2$ using an i-ray stepper. A paddle development using an aqueous solution of 2.38% tetramethylammonium chloride was given thereto to obtain a good relief pattern. The coating film was heated at 300° C. in an oven substituted with nitrogen to obtain a cured film having the film thickness of 7 μm.

A stud pull test as an adhesiveness test was performed using the obtained cured film on the wafer. A stud pin (Al with epoxy adhesive) model number 901106 (2.7 mm) supplied from Phototechnica Corporation was used for the stud pull test. The stud pin was adhered to the cured film by heating in the oven at 150° C. for one hour. As a result, the cured film showed an adhesive force of 68.6 MPa, and the adhesiveness to the Cu film was sufficient. The wafer cured similarly was treated at 121° C./0.20 MPa using a pressure cocker for 100 hours (hereinafter referred to as a "after the PCT treatment"), and subsequently the stud pull test was likewise performed. As a result, the cured film showed the adhesive force of 66.7 MPa, and the adhesiveness to the Cu film was not deteriorated after the PCT treatment.

Example 2

A positive-type photosensitive resin composition solution was made using the same composition as in Example 1, except that the polymer P-2 was used in place of the polymer P-1 and ureidopropyltriethoxysilane was used in place of bis(2-hydroxyethyl)-3-aminopropyltriethoxysilane. This positive-type photosensitive resin composition solution was treated in the same way as in Example 1, except that the exposure amount was 800 mJ/cm$^2$, and the test was performed. As a result, a good relief pattern was obtained by the exposure amount of 800 mJ/cm$^2$. The stud pull test of the cured film treated in the same way as in Example 1 was performed. As a result, the cured film showed the adhesive force of 66.7 MPa, and the adhesiveness to the Cu film was sufficient. Also after the OCT treatment, the adhesive force of 64.7 MPa was shown, and the adhesiveness to the Cu film was scarcely deteriorated after the PCT treatment.

Example 3

A positive-type photosensitive resin composition solution was made using the same composition as in Example 1, except that the polymer P-3 was used in place of the polymer P-1 and 1.0 g of a compound obtained by reacting tris(4-hydroxyphenyl)methane with naphthoquinone-1,2-diazide-5-sulfonyl chloride at a molar ratio of 1/2.8 was used in place of 1.50 g of the compound obtained by reacting 2-(4-hydroxyphenyl)-2-[4-[1,1-bis(4-hydroxyphenyl)ethyl]phenyl]propane with naphthoquinone-1,2-diazido-5-sulfonyl chloride at a molar ratio of 1/2.5. This positive-type photosensitive resin composition solution was treated in the same way as in Example 1, except that the exposure amount was 500 mJ/cm$^2$, and the test was performed. As a result, a good relief pattern was obtained by the exposure amount of 500 mJ/cm$^2$. The stud pull test of the cured film treated in the same way as in Example 1 was performed. As a result, the cured film showed the adhesive force of 70.6 MPa, and the adhesiveness to the Cu film was sufficient. Also the adhesive force of 67.7 MPa was shown after the PCT treatment, and the adhesiveness to the Cu film was scarcely deteriorated after the PCT treatment.

Example 4

A positive-type photosensitive resin composition solution was made using the same composition as in Example 1, except that the polymer P-4 was used in place of the polymer P-1, naphthoquinone-1,2-diazide-4-sulfonyl chloride was used in place of naphthoquinone-1,2-diazide-5-sulfonyl chloride and ureidopropyltriethoxysilane was used in place of bis(2-hydroxyethyl)-3-aminopropyltriethoxysilane. This positive-type photosensitive resin composition solution was treated in the same way as in Example 1, and the test was performed. As a result, a good relief pattern was obtained by the exposure amount of 700 mJ/cm$^2$. The stud pull test of the cured film obtained by treating in the same way as in Example 1 was performed. As a result, the cured film showed the adhesive force of 65.7 MPa, and the adhesiveness to the Cu film was sufficient. Also the adhesive force of 66.7 MPa was shown after the PCT treatment, and the adhesiveness to the Cu film was scarcely deteriorated after the PCT treatment.

Example 5

A positive-type photosensitive resin composition solution was made using the same composition as in Example 3, except that the polymer P-5 was used in place of the polymer P-3 and 1.5 g of the compound obtained by reacting 2-(4-hydroxyphenyl)-2-[4-[1,1-bis(4-hydroxyphenyl)ethyl]phenyl]propane with naphthoquinone-1,2-diazide-4-sulfonyl chloride at a molar ratio of 1/2.5 was used in place of 1.0 g of the compound obtained by reacting tris(4-hydroxyphenyl)methane with naphthoquinone-1,2-diazide-5-sulfonyl chloride at a molar ratio of 1/2.8. This positive-type photosensitive resin composition solution was treated in the same way as in Example 1, and the test was performed. As a result, a good relief pattern was obtained by the exposure amount of 700 mJ/cm$^2$. The stud pull test of the cured film obtained by treating in the same way as in Example 1 was performed. As a result, the cured film showed the adhesive force of 62.8 MPa, and the adhesiveness to the Cu film was sufficient. Also the adhesive force of 64.7 MPa was shown after the PCT treatment, and the adhesiveness to the Cu film was scarcely deteriorated after the PCT treatment.

Example 6

A positive-type photosensitive resin composition solution was made using the same composition as in Example 5, except that the polymer P-6 was used in place of the polymer P-5. This positive-type photosensitive resin composition solution was treated in the same way as in Example 1, and the test was performed. As a result, a good relief pattern was obtained by the exposure amount of 700 mJ/cm$^2$. The stud pull test of the cured film obtained by treating in the same way as in Example 1 was performed. As a result, the cured film showed the adhesive force of 63.7 MPa, and the adhesiveness to the Cu film was sufficient. Also the adhesive force of 64.7 MPa was shown after the PCT treatment, and the adhesiveness to the Cu film was scarcely deteriorated after the PCT treatment.

Example 7

A positive-type photosensitive resin composition solution was made using the same composition as in Example 1, except that the polymer P-7 was used in place of the polymer P-1. This positive-type photosensitive resin composition solution was treated in the same way as in Example 1, and the test was performed. As a result, a good relief pattern was obtained by the exposure amount of 700 mJ/cm$^2$. The stud pull test of the cured film obtained by treating in the same way as in Example 1 was performed. As a result, the cured film showed the adhesive force of 62.8 MPa, and the adhesiveness to the Cu film was sufficient. Also the adhesive force of 63.7 MPa was shown after the PCT treatment, and the adhesiveness to the Cu film was scarcely deteriorated after the PCT treatment.

Comparative Example 1

The test was performed in the same way as in Example 1, except that 1H-tetrazole was not combined, and a good relief pattern was obtained by the exposure amount of 700 mJ/cm$^2$. The stud pull test of the cured film obtained by treating in the same way as in Example 1 was performed. As a result, the cured film showed the adhesive force of 66.7 MPa, and the adhesiveness to the Cu film was sufficient. The adhesive force of 9.81 MPa was shown after the PCT treatment, and the adhesive force was reduced by the PCT treatment.

Comparative Example 2

The test was performed in the same way as in Example 2, except that 1H-tetrazole was not combined, and a good relief pattern was obtained by the exposure amount of 800 mJ/cm$^2$. The stud pull test of the cured film obtained by treating in the same way as in Example 1 was performed. As a result, the cured film showed the adhesive force of 65.7 MPa, and the adhesiveness to the Cu film was sufficient. The adhesive force of 12.7 MPa was shown after the PCT treatment, and the adhesive force was reduced by the PCT treatment.

Comparative Example 3

The test was performed in the same way as in Example 3, except that 1H-tetrazole was not combined, and a good relief pattern was obtained by the exposure amount of 500 mJ/cm$^2$. The stud pull test of the cured film obtained by treating in the same way as in Example 1 was performed. As a result, the cured film showed the adhesive force of 66.7 MPa, and the adhesiveness to the Cu film was sufficient. The adhesive force of 6.86 MPa was shown after the PCT treatment, and the adhesive force was reduced by the PCT treatment.

Comparative Example 4

The test was performed in the same way as in Example 4, except that 1H-tetrazole was not combined, and a good relief pattern was obtained by the exposure amount of 700 mJ/cm$^2$. The stud pull test of the cured film obtained by treating in the same way as in Example 1 was performed. As a result, the cured film showed the adhesive force of 64.7 MPa, and the adhesiveness to the Cu film was sufficient. The adhesive force of 10.8 MPa was shown after the PCT treatment, and the adhesive force was reduced by the PCT treatment.

Comparative Example 5

The test was performed in the same way as in Example 5, except that 1H-tetrazole was not combined, and a good relief pattern was obtained by the exposure amount of 700 mJ/cm$^2$. The stud pull test of the cured film obtained by treating in the same way as in Example 1 was performed. As a result, the cured film showed the adhesive force of 63.7 MPa, and the adhesiveness to the Cu film was sufficient. The adhesive force of 9.81 MPa was shown after the PCT treatment, and the adhesive force was reduced by the PCT treatment.

Comparative Example 6

The treatment was performed in the same way as in Example 1, except that 10 g of the polymer P-1 obtained in Synthesis Example 1, 15 g of γ-butylolactone, 1.50 g of the compound obtained by reacting 2-(4-hydroxyphenyl)-2-[4-[1,1-bis(4-hydroxyphenyl)ethyl]phenyl]propane with naphthoquinone-1,2-diazido-5-sulfonyl chloride at a molar ratio of 1/2.5, 0.10 g of dodecyl mercaptan and 0.20 g of bis(2-hydroxyethyl)-3-aminopropyltriethoxysilane were used as combined materials. Most films were delaminated by the development, and no good relief pattern was obtained. Thus, the stud pull test could not be performed.

Comparative Example 7

The test was performed in the same way as in Example 6, except that 1H-tetrazole was not combined, and a good relief pattern was obtained by the exposure amount of 700 mJ/cm². The stud pull test of the cured film obtained by treating in the same way as in Example 1 was performed. As a result, the cured film showed the adhesive force of 62.8 MPa, and the adhesiveness to the Cu film was sufficient. The adhesive force of 14.7 MPa was shown after the PCT treatment, and the adhesive force was reduced by the PCT treatment.

Comparative Example 8

Comparative Example of Triazole Compound

A positive-type photosensitive resin composition solution was made using the same composition as in Example 1, except that benzotriazole was used in place of 1H-tetrazole. This positive-type photosensitive resin composition solution was treated in the same way as in Example 1, and the test was performed. As a result, a good relief pattern was obtained by the exposure amount of 700 mJ/cm². The stud pull test of the cured film obtained by treating in the same way as in Example 1 was performed. As a result, the cured film showed the adhesive force of 66.7 MPa, and the adhesiveness to the Cu film was sufficient. Also the adhesive force of 1.96 MPa was shown after the PCT treatment, and the adhesiveness was reduced by the PCT treatment.

Combinations of each polymer and the nitrogen-containing heterocyclic compound and results of the adhesive forces in Examples 1 to 7 and Comparative Examples 1 to 8 are summarized in Table 1

TABLE 1

| Item | Polymer | Nitrogen-containing heterocyclic compound | Pattern formation | Adhesiveness (MPa) Before PCT | Adhesiveness (MPa) After PCT |
|---|---|---|---|---|---|
| Example 1 | P-1 | 1H-tertazole | Good | 68.6 | 66.7 |
| Example 2 | P-2 | 1H-tertazole | Good | 66.7 | 64.7 |
| Example 3 | P-3 | 1H-tertazole | Good | 70.6 | 67.7 |
| Example 4 | P-4 | 1H-tertazole | Good | 65.7 | 66.7 |
| Example 5 | P-5 | 1H-tertazole | Good | 62.8 | 64.7 |
| Example 6 | P-6 | 1H-tertazole | Good | 63.7 | 64.7 |
| Example 7 | P-7 | 1H-tertazole | Good | 62.8 | 63.7 |
| Comparative Example 1 | P-1 | — | Good | 66.7 | 9.81 |
| Comparative Example 2 | P-2 | — | Good | 65.7 | 12.7 |
| Comparative Example 3 | P-3 | — | Good | 66.7 | 6.86 |
| Comparative Example 4 | P-4 | — | Good | 64.7 | 10.8 |
| Comparative Example 5 | P-5 | — | Good | 63.7 | 9.81 |
| Comparative Example 6 | P-1 | Dodecyl mercaptan | *Delaminated | — | — |
| Comparative Example 7 | P-6 | — | Good | 62.8 | 14.7 |
| Comparative Example 8 | P-1 | Benzotriazole | Good | 67.7 | 1.96 |

*Most films were delaminated by the development.

INDUSTRIAL APPLICABILITY

As the above, the photosensitive resin composition according to the present invention is excellent in heat resistance and adhesiveness, particularly film adhesiveness, sensitivity, resolution and residual film prevention effect under the harsh condition such as heating and applying the pressure. Thus, the relief pattern having the good shape can be obtained. Therefore, the photosensitive resin composition according to the present invention is excellent in reliability and is particularly suitable for producing the electronic parts.

The invention claimed is:

1. A positive-type photosensitive resin composition comprising:

(A) a polybenzoxazole precursor having a structure represented by the following general formula (I):

wherein X represents a bivalent organic group, Y represents a tetravalent organic group, $R_1$ represents a hydrogen atom or a monovalent organic group, and m represents an integer of 2 to 500 and represents a repeating unit number of the polymer;

(B) a solvent;

(C) a tetrazole derivative; and (D) a compound which generates an acid by light.

2. The positive-type photosensitive resin composition according to claim 1, wherein both end portions of the (A) polybenzoxazole precursor represented by the general formula (I) have a cyclic bond not having a reactive unsaturated bond, a reactive unsaturated bond or an acyclic saturated bond, respectively.

3. The positive-type photosensitive resin composition according to claim 1, wherein X and Y in the (A) polybenzoxazole precursor represented by the general formula (I) are one or two or more cyclic aliphatic groups or aromatic groups, respectively, and the two or more cyclic aliphatic groups or aromatic groups are mutually bound via a single bond, an organic group or at least one heteroatom selected from the group consisting of oxygen, sulfur, nitrogen and silicon.

4. The positive-type photosensitive resin composition according to claim 1, wherein the (D) compound which generates the acid by the light is an o-quinone diazide compound.

5. A method for producing a pattern comprising the steps of:
applying and drying the positive-type photosensitive resin composition according to claim 1 on a support substrate;
exposing a photosensitive resin film obtained by the applying and drying to make a predetermined pattern;
developing the photosensitive resin film after the exposure using an alkali aqueous solution; and
treating the photosensitive resin film after the development with heat.

6. Electronic parts having a layer of a pattern obtained by the method for producing the pattern according to claim 5.

* * * * *